(12) United States Patent
Alptekin et al.

(10) Patent No.: US 9,818,873 B2
(45) Date of Patent: Nov. 14, 2017

(54) FORMING STRESSED EPITAXIAL LAYERS BETWEEN GATES SEPARATED BY DIFFERENT PITCHES

(71) Applicant: GLOBALFOUNDRIES Inc., Grand Cayman (KY)

(72) Inventors: Emre Alptekin, Wappingers Falls, NY (US); Lars W. Liebmann, Poughquag, NY (US); Injo Ok, Loudonville, NY (US); Balasubramanian Pranatharthiharan, Watervliet, NY (US); Ravikumar Ramachandran, Pleasantville, NY (US); Soon-Cheon Seo, Glenmont, NY (US); Charan V. V. S. Surisetty, Clifton Park, NY (US); Mickey H. Yu, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/879,220

(22) Filed: Oct. 9, 2015

(65) Prior Publication Data

US 2017/0104100 A1    Apr. 13, 2017

(51) Int. Cl.
*H01L 29/40* (2006.01)
*H01L 29/78* (2006.01)
*H01L 27/088* (2006.01)
*H01L 21/8234* (2006.01)
(Continued)

(52) U.S. Cl.
CPC .... *H01L 29/7848* (2013.01); *H01L 21/32139* (2013.01); *H01L 21/823418* (2013.01); *H01L 21/823425* (2013.01); *H01L 21/823431* (2013.01); *H01L 21/823437* (2013.01); *H01L 21/823475* (2013.01); *H01L 27/0886* (2013.01);
(Continued)

(58) Field of Classification Search
CPC ..... H01L 21/823431; H01L 21/823437; H01L 21/823418; H01L 21/823425; H01L 21/32139; H01L 29/66636; H01L 29/66795; H01L 29/7848; H01L 29/785; H01L 27/0886; H01L 29/401
See application file for complete search history.

(56) References Cited

U.S. PATENT DOCUMENTS

| 8,969,163 B2 | 3/2015 | Aquilino et al. |
| 2011/0115000 A1* | 5/2011 | Yang ............... H01L 21/823807 257/288 |
| 2014/0363984 A1* | 12/2014 | Fukuda ............... H01L 21/0274 438/778 |

* cited by examiner

*Primary Examiner* — Daniel Luke
(74) *Attorney, Agent, or Firm* — Yuanmin Cai; Hoffman Warnick LLC

(57) ABSTRACT

Various embodiments include methods and integrated circuit structures. In some cases, a method of forming an integrated circuit structure can include: forming a doped silicon layer over a substrate; forming a plurality of fin structures from the doped silicon layer; forming a plurality of gate structures over the plurality of fin structures, each of the plurality of gate structures separated from a neighboring gate structure by a first pitch; forming a mask over the plurality of gate structures, exposing at least one of the plurality of gate structures; removing the at least one of the plurality of gate structures, wherein two of the remaining gate structures after the removing are separated by a second pitch larger than the first pitch; and forming an epitaxial region over the substrate between the two of the remaining gate structures.

14 Claims, 12 Drawing Sheets

(51) Int. Cl.
*H01L 29/66* (2006.01)
*H01L 21/3213* (2006.01)
(52) U.S. Cl.
CPC ...... *H01L 29/401* (2013.01); *H01L 29/66636* (2013.01); *H01L 29/66795* (2013.01)

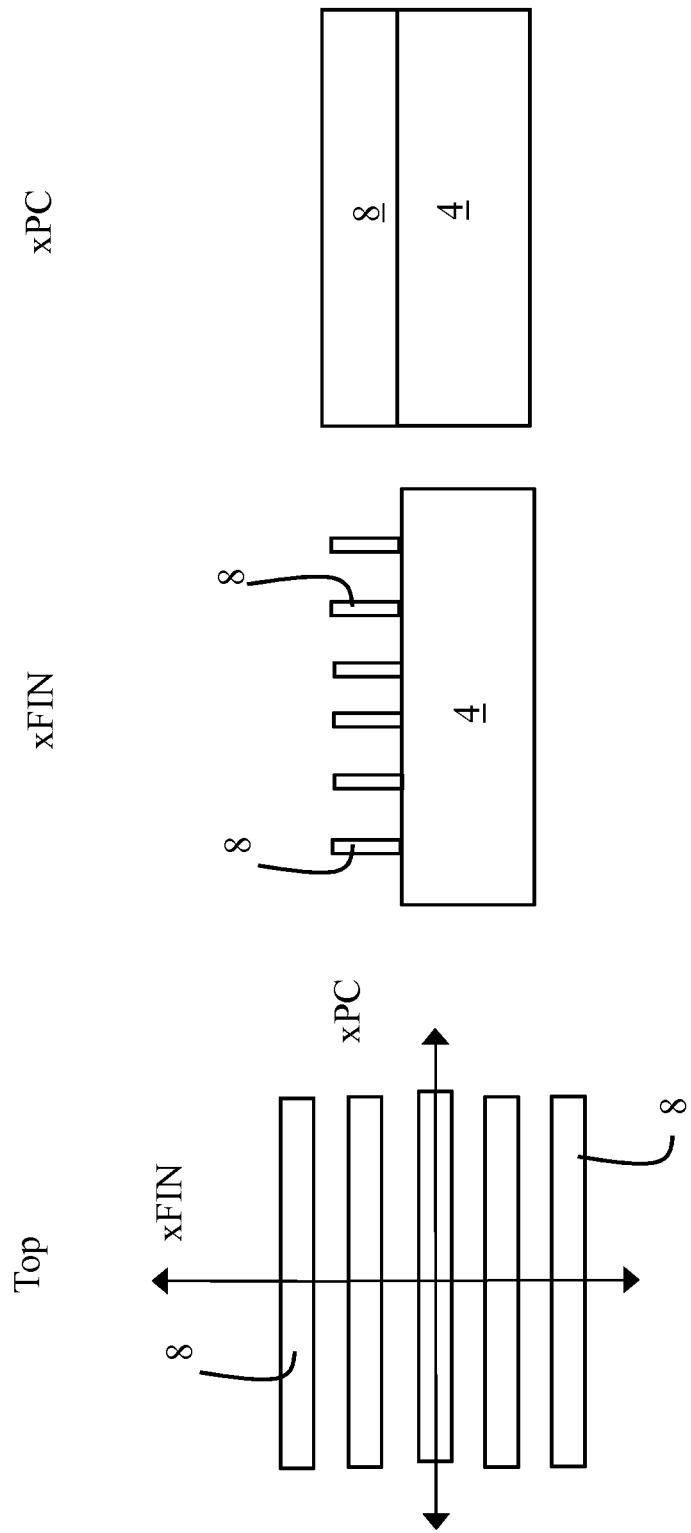

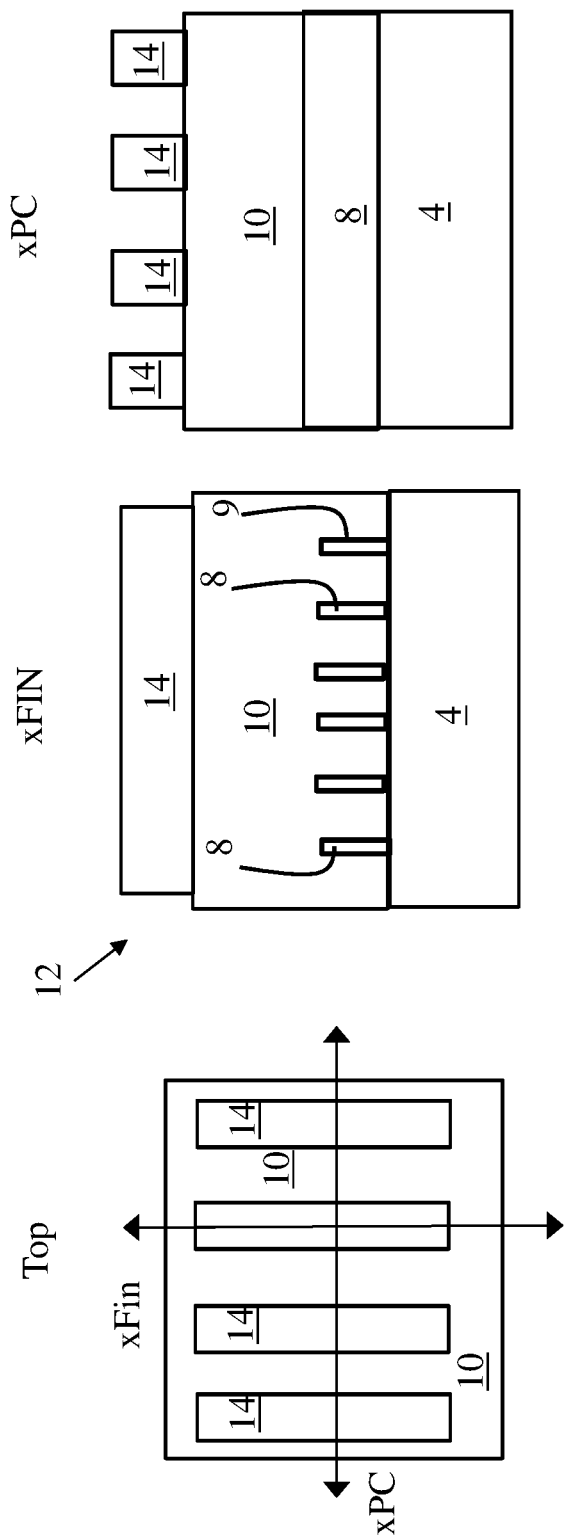

FORMING STRESSED EPITAXIAL LAYERS BETWEEN GATES SEPARATED BY DIFFERENT PITCHES

BACKGROUND

The subject matter disclosed herein relates to integrated circuit devices. More particularly, the subject matter relates to forming gate structures in integrated circuit devices.

As integrated circuit (IC) technologies have advanced, the size of these devices has correspondingly decreased. In particular, as devices are reduced in scale to comply with ever-smaller packaging, tighter constraints are applied to their dimensions and spacings.

Stressing gate regions in IC devices is an effective mechanism for improving the performance (e.g., speed) of signals passing through those gate regions. However, as device dimensions are reduced, the distance (pitch) between adjacent IC gates is reduced. This reduced gate pitch makes it more difficult to effectively stress the gate region during formation of the IC, negatively affecting performance. Further, reduced gate pitch can lead to reduced contact resistivity, contact-to-gate shorts, as well as other undesirable conditions.

SUMMARY

Various embodiments include methods and integrated circuit structures. In some cases, a method of forming an integrated circuit structure can include: forming a doped silicon layer over a substrate; forming a plurality of fin structures from the doped silicon layer; forming a plurality of gate structures over the plurality of fin structures, each of the plurality of gate structures separated from a neighboring gate structure by a first pitch; forming a mask over the plurality of gate structures, exposing at least one of the plurality of gate structures; removing the at least one of the plurality of gate structures, wherein two of the remaining gate structures after the removing are separated by a second pitch larger than the first pitch; and forming an epitaxial region over the substrate between the two of the remaining gate structures.

A first aspect of the disclosure includes a method of forming an integrated circuit structure, the method including: forming a doped silicon layer over a substrate; forming a plurality of fin structures from the doped silicon layer; forming a plurality of gate structures over the plurality of fin structures, each of the plurality of gate structures separated from a neighboring gate structure by a first pitch; forming a mask over the plurality of gate structures, exposing at least one of the plurality of gate structures; removing the at least one of the plurality of gate structures, wherein two of the remaining gate structures after the removing are separated by a second pitch larger than the first pitch; and forming an epitaxial region over the substrate between the two of the remaining gate structures.

A second aspect of the disclosure includes a method of forming an integrated circuit structure, the method including: forming a doped silicon layer over a substrate; forming a plurality of fin structures from the doped silicon layer; forming a plurality of gate structures over the plurality of fin structures, each of the plurality of gate structures separated from a neighboring gate structure by a first pitch; forming a mask over the plurality of gate structures, exposing at least one of the plurality of gate structures; removing the at least one of the plurality of gate structures, wherein two of the remaining gate structures after the removing are separated by a second pitch larger than the first pitch; forming a first epitaxial region over the substrate between the two of the remaining gate structures; forming a plurality of epitaxial regions over the substrate between the plurality of gate structures separated by the first pitch; and forming a contact over the first epitaxial region to directly contact the first epitaxial region.

A third aspect of the disclosure includes an integrated circuit (IC) structure having: a substrate; a plurality of fin structures over the substrate and directly contacting the substrate; a plurality of gate structures over the plurality of fin structures, wherein two neighboring gate structures in the plurality of gate structures are separated by a first pitch, and where two distinct neighboring gate structures in the plurality of gate structures are separated by a second pitch, the second pitch being greater than the first pitch, a plurality of epitaxial regions over the substrate and the plurality of fin structures and between each of the plurality of gate structures, the plurality of epitaxial regions including: a first epitaxial region spanning the first pitch between the two neighboring gate structures; and a second epitaxial region spanning the second pitch between the two distinct neighboring gate structures; and a contact directly contacting the second epitaxial region.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 2a shows a schematic top view of a structure undergoing a process according to various embodiments.

FIG. 2b shows a schematic cross-sectional view of the structure of FIG. 2a, with the cross-section through a fin structure.

FIG. 2c shows a schematic cross-sectional view of the structure of FIG. 2a, with the cross-section through a gate contact structure.

FIG. 6a shows a schematic top view of a structure undergoing a process according to various embodiments.

FIG. 6b shows a schematic cross-sectional view of the structure of FIG. 6a, with the cross-section through a fin structure.

FIG. 6c shows a schematic cross-sectional view of the structure of FIG. 6a, with the cross-section through a gate contact structure.

DETAILED DESCRIPTION

As noted, the subject matter disclosed herein relates to integrated circuit (IC) devices. More particularly, the subject matter relates to forming gate structures in integrated circuit devices.

In contrast to conventional approaches, various embodiments of the disclosure include approaches for forming gate structures, whereby dummy gates are formed to expand the epitaxial (or, "epi") region and create a desired stressing in this region. This stressing can help to increase contact resistivity and/or reduce contact-to-gate shorts in the gate region. Epitaxial (or, "epi") layers, or regions, consist of a thin, single crystal silicon layer grown on the polished surface of a silicon wafer substrate. This epi layer is designed to have different compositional and electrical properties from the underlying wafer, tailored to the specific demands of the device to be fabricated. As described herein, various embodiments of the disclosure include methods of forming IC devices, and the IC devices formed by such methods, which employ an expanded epi region between device gates to enhance performance.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

As described herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIGS. 1-12B show schematic cross-sectional depictions of integrated circuit structures (and precursor structures) that illustrate processes performed according to various embodiments. It is understood that the processes outlined herein may be performed in a different order than described in some embodiments. Additionally, not all of the processes outlined herein need necessarily be performed according to various embodiments.

Figure 1:
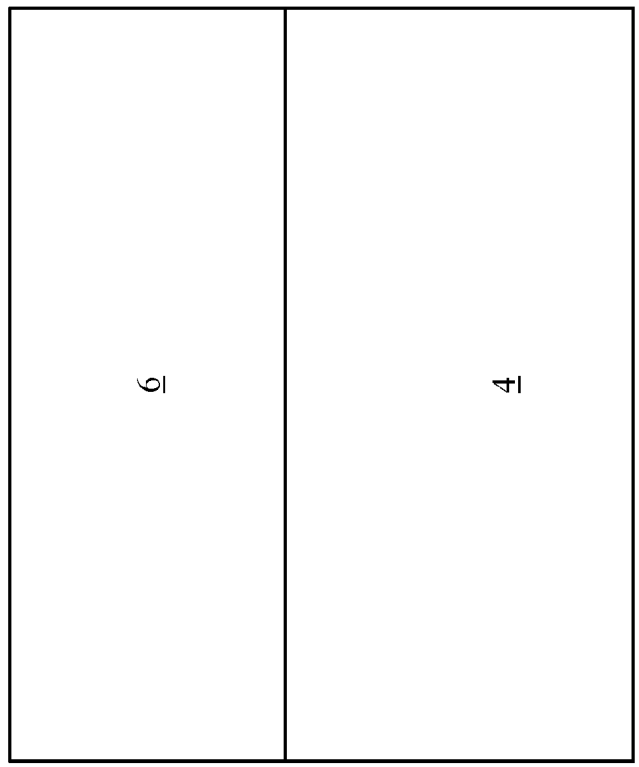
FIG. 1 shows a schematic cross-sectional depiction of a precursor structure according to various embodiments.

Turning to FIG. 1, a schematic depiction of a process performed on a precursor structure 2 is shown according to various embodiments. As shown, this process can include forming a doped silicon layer 6 over a substrate (e.g., including silicon and/or silicon dioxide) 4. As shown herein, doped silicon layer 6 is used to subsequently form fin(s) according to various embodiments. In various embodiments doped silicon layer 6 can include elemental semiconductor materials (e.g., silicon, germanium, carbon, or alloys thereof), III-V semiconductor materials, or II-VI semiconductor materials. According to various embodiments, the doped silicon layer 6 is deposited over substrate as a bulk silicon, and subsequently ionized to dope the bulk silicon material. In other cases, a portion of substrate 4 is ionized (e.g., subjected to ionizing radiation) to form doped silicon layer 6 at an upper portion of what previously was substrate 4. FIG. 2 (including views 2a, 2b, and 2c) illustrates a subsequent process, in three views (top, cross-section across fins (xFin) and cross-section through a gate contact (xPC), not yet formed, and subsequently formed perpendicular to fin), of forming a plurality of fin structures 8 from doped silicon layer 6. FIG. 2a shows a schematic top view of a structure undergoing a process according to various embodiments. FIG. 2b shows a schematic cross-sectional view of the structure of FIG. 2a, with the cross-section through a fin structure. FIG. 2c shows a schematic cross-sectional view of the structure of FIG. 2a, with the cross-section through a gate contact structure. In various embodiments, a conventional masking and etching process can be employed to form fin structures 8 from doped silicon layer 6, e.g., including forming a hard mask over doped silicon layer 6 and etching the underlying doped silicon layer 6 using the mask to remove portions of doped silicon layer between fin structures 8.

Figure 3C:
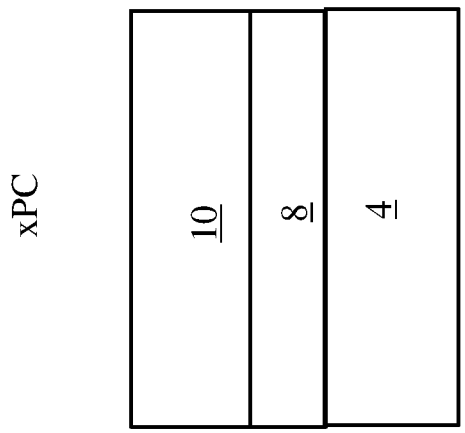
FIG. 3c shows a schematic cross-sectional view of the structure of FIG. 3a, with the cross-section through a gate contact structure.
Figure 3B:
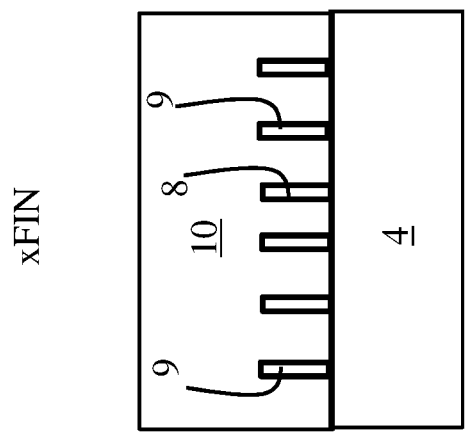
FIG. 3b shows a schematic cross-sectional view of the structure of FIG. 3a, with the cross-section through a fin structure.
Figure 3A:
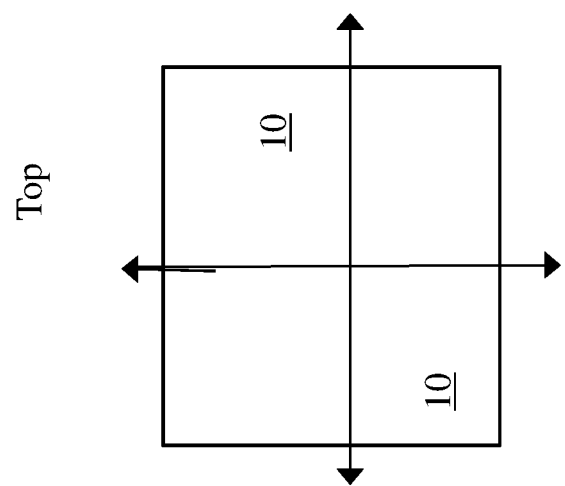
FIG. 3a shows a schematic top view of a structure undergoing a process according to various embodiments.
Figure 4C:
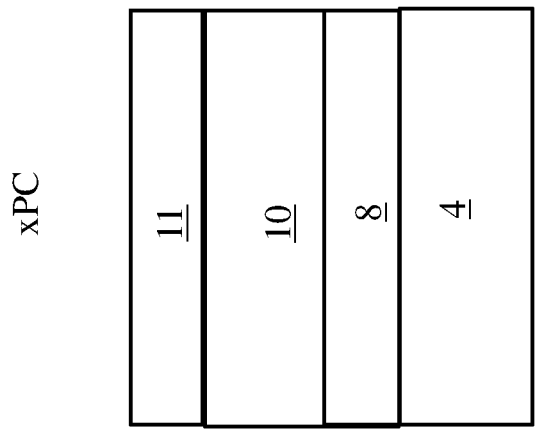
FIG. 4c shows a schematic cross-sectional view of the structure of FIG. 4a, with the cross-section through a gate contact structure.
Figure 4B:
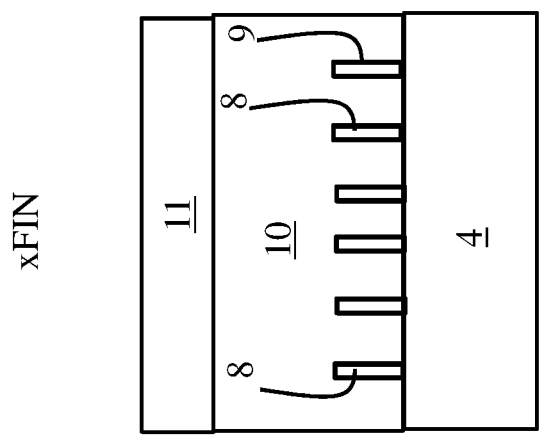
FIG. 4b shows a schematic cross-sectional view of the structure of FIG. 4a, with the cross-section through a fin structure.
Figure 4A:
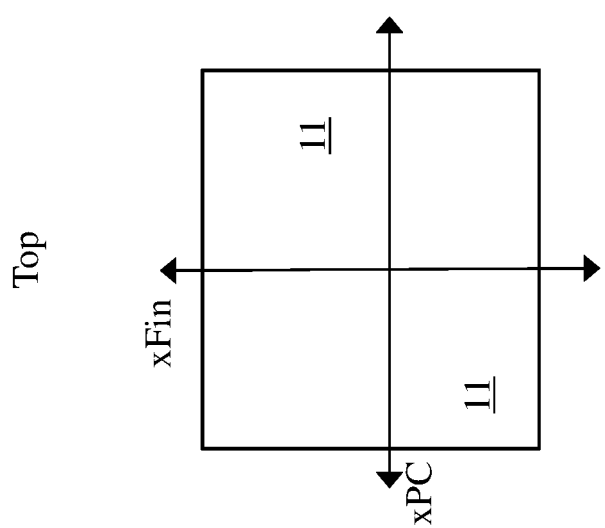
FIG. 4a shows a schematic top view of a structure undergoing a process according to various embodiments.
Figure 5C:
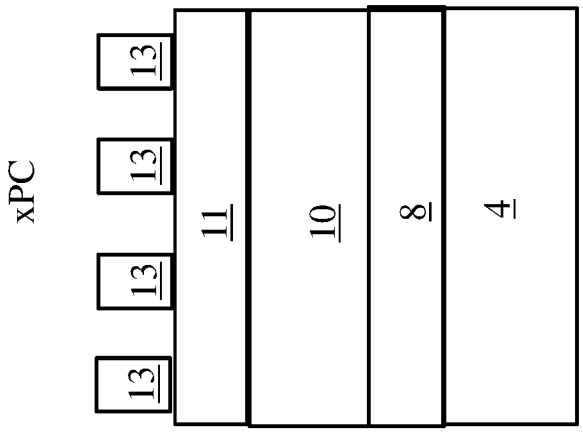
FIG. 5c shows a schematic cross-sectional view of the structure of FIG. 5a, with the cross-section through a gate contact structure.
Figure 5B:
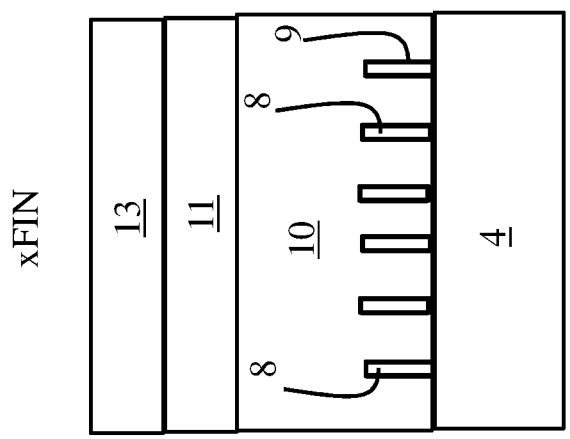
FIG. 5b shows a schematic cross-sectional view of the structure of FIG. 5a, with the cross-section through a fin structure.
Figure 5A:
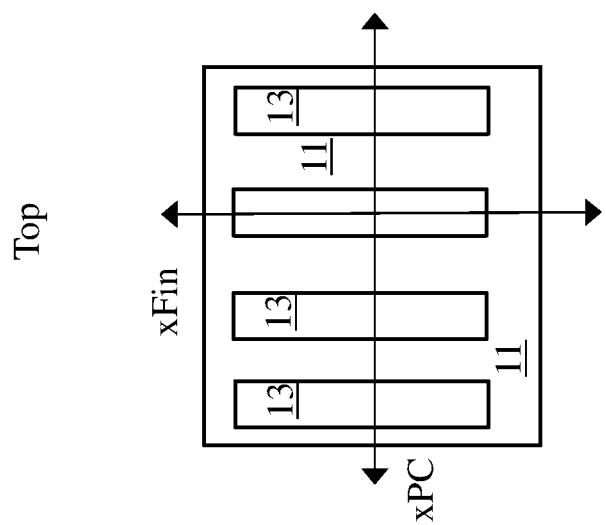
FIG. 5a shows a schematic top view of a structure undergoing a process according to various embodiments.

FIG. 3 (including views 3a, 3b, and 3c) illustrates an intermediate process in forming an integrated circuit (IC) structure according to embodiments. FIG. 3a shows a schematic top view of a structure undergoing a process according to various embodiments. FIG. 3b shows a schematic cross-sectional view of the structure of FIG. 3a, with the cross-section through a fin structure. FIG. 3c shows a schematic cross-sectional view of the structure of FIG. 3a, with the cross-section through a gate contact structure. As shown, FIG. 3 illustrates a process including depositing a dielectric liner 9 over fin structures 8 and underlying substrate 4, and forming a gate layer 10 over dielectric liner layer 9. The dielectric liner layer 9 can include silicon dioxide, nitridized silicon dioxide, or combination with high K material. Gate layer 10 can include semiconductor material, (e.g., polycrystalline Si or an amorphous Si) a dielectric material, or a metal, depending on the patterning method used for subsequent formation of a gate. In various embodiments, dielectric liner layer 9 and gate layer 10 are disposable if the gate structure is formed after a source region and drain region. Gate layer 10 can be planarized over dielectric liner layer 9 using conventional chemical-mechanical polishing (CMP). FIG. 4 (including views 4a, 4b, and 4c) illustrates an additional process including forming a gate hard mask 11 (e.g., via conventional deposition techniques described herein) over gate layer 10. FIG. 4a shows a schematic top view of a structure undergoing a process according to various embodiments. FIG. 4b shows a schematic cross-sectional view of the structure of FIG. 4a, with the cross-section through a fin structure. FIG. 4c shows a schematic cross-sectional view of the structure of FIG. 4a, with the cross-section through a gate contact structure. Gate hard mask 11 can include silicon nitride or a combination of silicon nitride and silicon dioxide, or any dielectric layer which aids in formation of a gate pattern. FIG. 5 (including views 5a, 5b, and 5c) illustrates a process including forming a patterned photoresist layer 13 over gate hard mask 11, using conventional photolithography techniques, including but not limited to deep ultraviolet (DUV) or extreme ultraviolet (EUV) processes, sidewall imaging transfer processes, or multiple patterning processes. FIG. 5a shows a schematic top view of a structure undergoing a process according to various embodiments. FIG. 5b shows a schematic cross-sectional view of the structure of FIG. 5a, with the cross-section through a fin structure. FIG. 5c shows a schematic cross-sectional view of the structure of FIG. 5a, with the cross-section through a gate contact structure. The pattern of photoresist layer 13 is transferred into hard mask 11 using conventional RIE (reactive ion plasma etching) to form patterned gate hard mask 14 shown in FIG. 6 (including views 6a, b, and 6c). The remaining photoresist layer 13 can be removed by conventional methods, e.g., by dry plasma ashing or (selectively) wet cleaning (e.g., using sulfuric peroxide). FIG. 6a shows a schematic top view of a structure undergoing a process according to various embodiments. FIG. 6b shows a schematic cross-sectional view of the structure of FIG. 6a, with the cross-section through a fin structure. FIG. 6c shows a schematic cross-sectional view of the structure of FIG. 6a, with the cross-section through a gate contact structure.

Figures 7A, 7B, 7C:
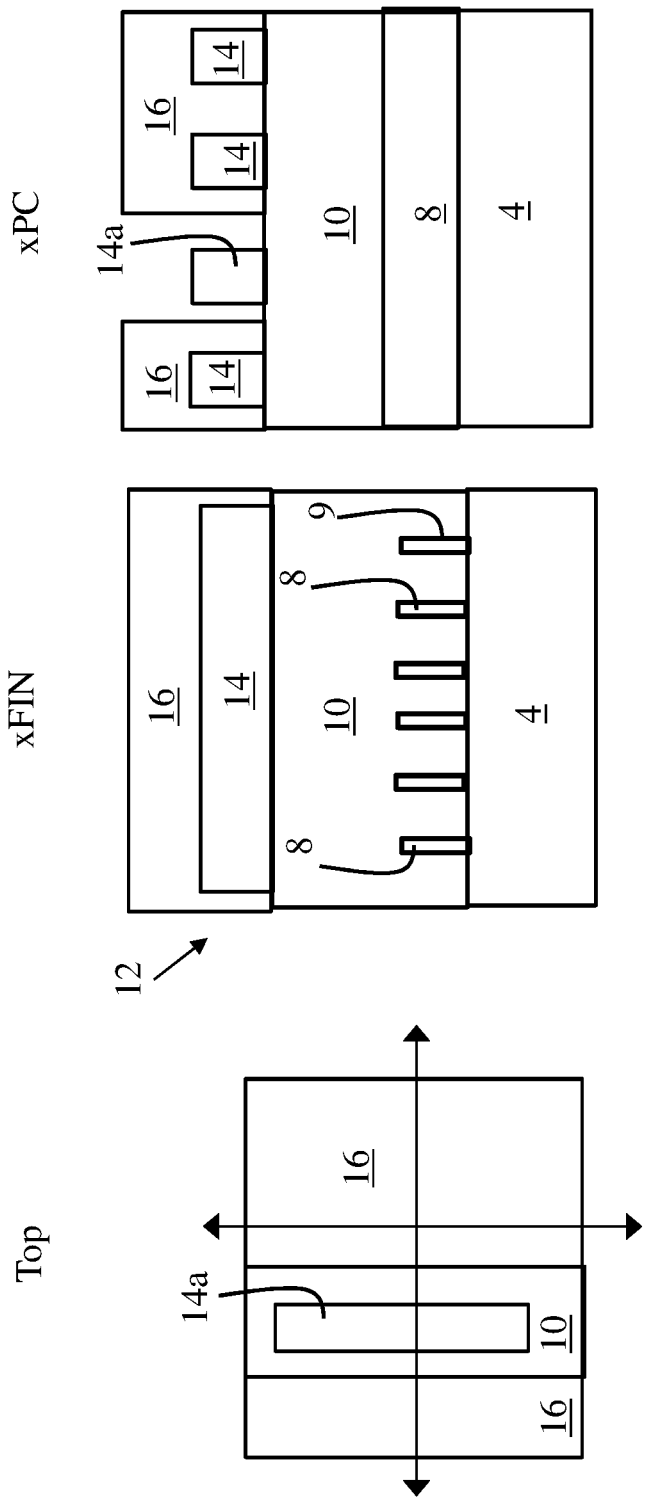
FIG. 7a shows a schematic top view of a structure undergoing a process according to various embodiments.
FIG. 7b shows a schematic cross-sectional view of the structure of FIG. 7a, with the cross-section through a fin structure.
FIG. 7c shows a schematic cross-sectional view of the structure of FIG. 7a, with the cross-section through a gate contact structure.

FIG. 7 (including views 7a, 7b, and 7c) illustrates an additional process including forming a photoresist 16 patterning over gate hard mask 14 and underlying gate layer 10, which may be performed using any using any conventional lithography technique described herein, for example, including DUV, EUV, any sidewall image transfer technique described herein, or any multiple patterning technique described herein and/or known in the art. Forming photoresist 16 and patterning photoresist 16 exposes a section 14a of gate hard mask 14 for subsequent removal, as described further herein. FIG. 7a shows a schematic top view of a structure undergoing a process according to various embodiments. FIG. 7b shows a schematic cross-sectional view of the structure of FIG. 7a, with the cross-section through a fin structure. FIG. 7c shows a schematic cross-sectional view of the structure of FIG. 7a, with the cross-section through a gate contact structure.

Figure 8C:
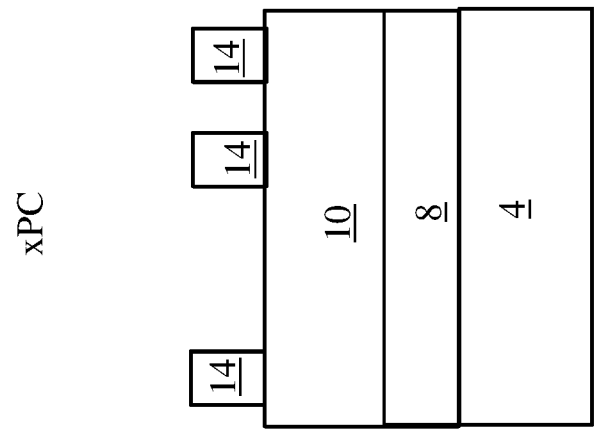
FIG. 8c shows a schematic cross-sectional view of the structure of FIG. 8a, with the cross-section through a gate contact structure.
Figure 8B:
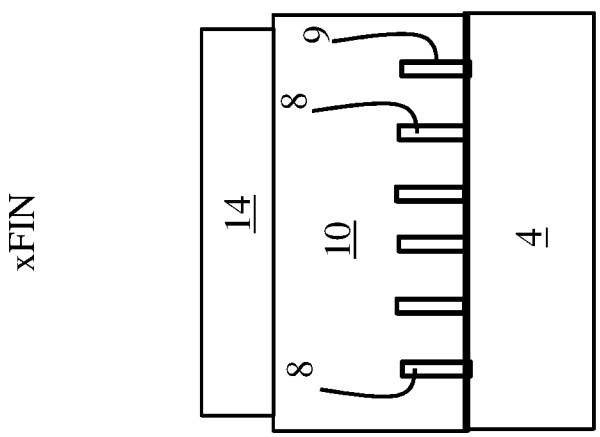
FIG. 8b shows a schematic cross-sectional view of the structure of FIG. 8a, with the cross-section through a fin structure.
Figure 8A:
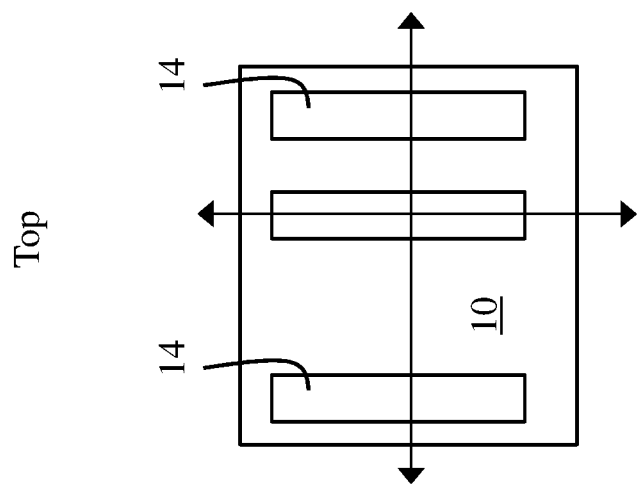
FIG. 8a shows a schematic top view of a structure undergoing a process according to various embodiments.

FIG. 8 (including views 8a, 8b, and 8c) illustrates another intermediate process, including dry or wet etching to remove section 14a of dummy gate hard mask using photoresist 16 as a mask. FIG. 8a shows a schematic top view of a structure undergoing a process according to various embodiments. FIG. 8b shows a schematic cross-sectional view of the structure of FIG. 8a, with the cross-section through a fin structure. FIG. 8c shows a schematic cross-sectional view of the structure of FIG. 8a, with the cross-section through a gate contact structure. Photoresist 16 can then be selectively etched away, for example, with dry plasma ashing or wet cleaning, including but not limited to sulfuric peroxide-based chemistry.

Figure 9A:
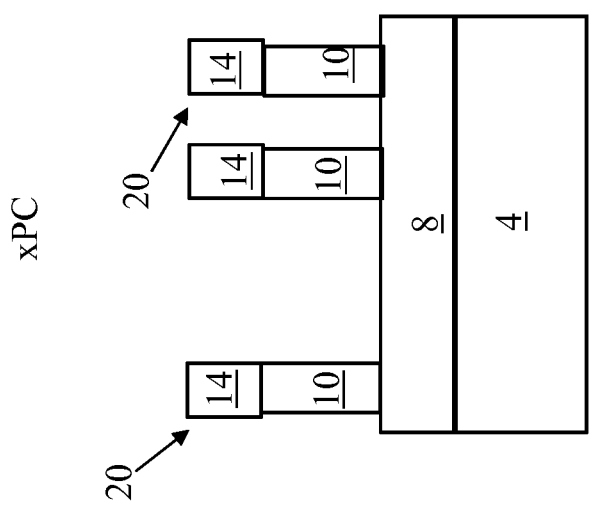
FIG. 9a shows a schematic top view of a structure undergoing a process according to various embodiments.
Figure 9B:
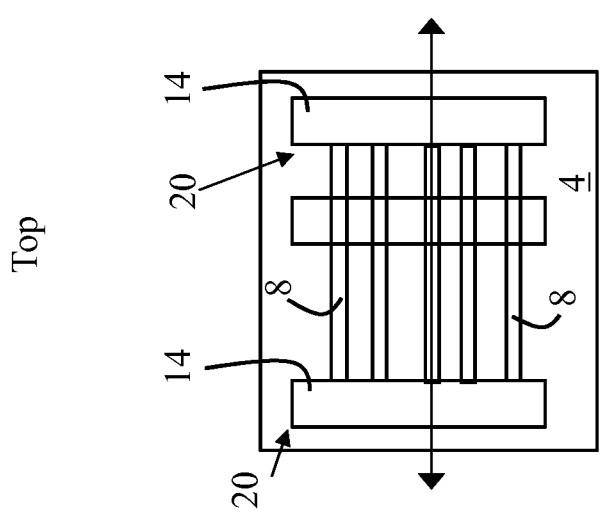
FIG. 9b shows a schematic cross-sectional view of the structure of FIG. 9a, with the cross-section through a gate contact structure.

FIG. 9 (including views 9a and 9b) illustrates an additional process including patterning gate layer 10 to form gate structures 20 and expose fin structures 8. FIG. 9a shows a schematic top view of a structure undergoing a process according to various embodiments. FIG. 9b shows a schematic cross-sectional view of the structure of FIG. 9a, with the cross-section through a gate contact structure. As shown, gate structures 20 include a portion of gate layer 10 with an overlying section of gate hard mask 14. Gate patterning can be performed using any conventional patterning approach, for example, an RIE process that is selective to nitride and/or oxide. Fin structures 8 are shown perpendicular to gate structures 20 (visible in top view). It is understood that FIG. 9 illustrates several additional gate structures 20 when compared with FIG. 8 and preceding figures, which is feasible for illustrative purposes with the omission of the xFin view in FIGS. 9-11.

Figure 10B:
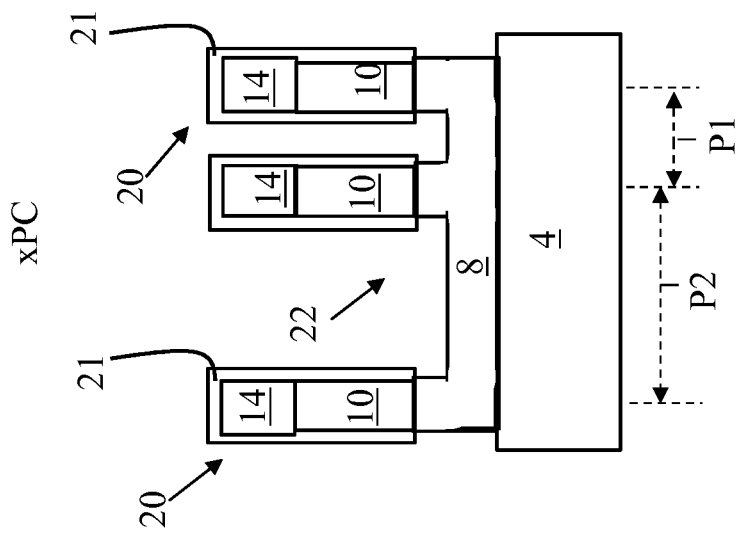
FIG. 10b shows a schematic cross-sectional view of the structure of FIG. 10a, with the cross-section through a gate contact structure.
Figure 10A:
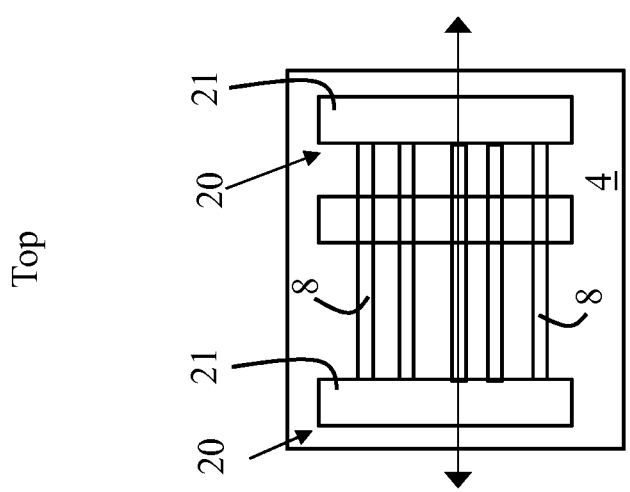
FIG. 10a shows a schematic top view of a structure undergoing a process according to various embodiments.

FIG. 10 (including views 10a and 10b) shows a process including depositing a spacer layer 21, forming spacer 21 over gate layer 10, and recessing fins 8 between gate structures 20 to form recesses 22. FIG. 10a shows a schematic top view of a structure undergoing a process according to various embodiments. FIG. 10b shows a schematic cross-sectional view of the structure of FIG. 10a, with the cross-section through a gate contact structure. Spacer 21 can include, e.g., SiN, SiBCN, SiOCN, or any type of low K (K<6) material. Spacer 21 can be formed using an anisotropic RIE process. In various embodiments, this etching process can include using a silicon nitride (SiN) etch sensitive to the plurality of fin structures 8. As shown, some gate structures 20 are separated from their neighboring gate structures 20 by a first pitch P1 (center-to-center distance between gate structures, along axis perpendicular with upper surface of substrate 4), while others are separated from their neighboring gate structures 20 by a second pitch P2, where the second pitch is greater than the first pitch P2 (due to removal of hard mask 14 corresponding with gate structures 20). In some cases, P2 is approximately two times the value of P1.

Figure 11B:
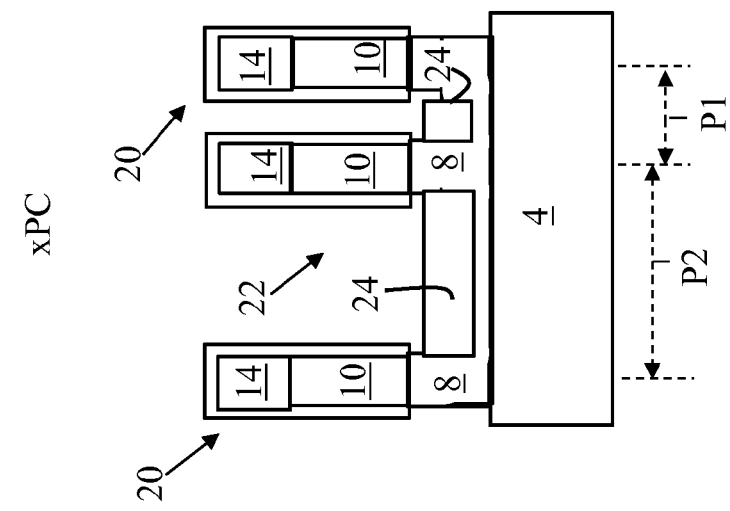
FIG. 11b shows a schematic cross-sectional view of the structure of FIG. 11a, with the cross-section through a gate contact structure.
Figure 11A:
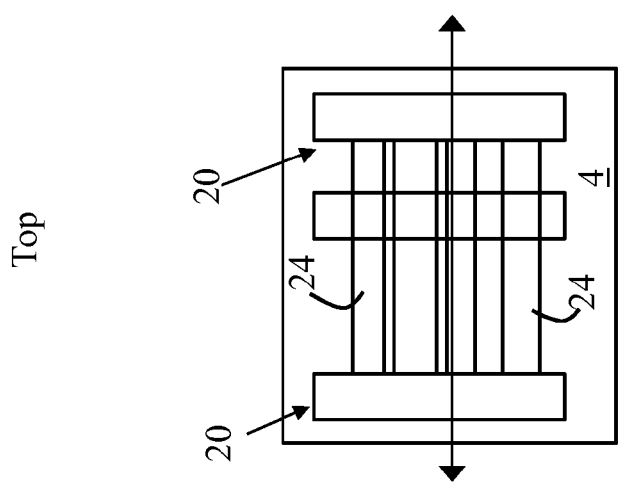
FIG. 11a shows a schematic top view of a structure undergoing a process according to various embodiments.

FIG. 11 (including views 11a and 11b) illustrates a process including forming a (source/drain) epitaxial region 24 over fin 8 between gate structures 20. FIG. 11a shows a schematic top view of a structure undergoing a process according to various embodiments. FIG. 11b shows a schematic cross-sectional view of the structure of FIG. 11a, with the cross-section through a gate contact structure. In various embodiments, a plurality of epitaxial regions 24 are formed over fin 8 between gate structures 20, and in some cases, the plurality of epitaxial regions 24 are formed between gate structures 20 separated by first pitch P1. As described herein, epitaxial regions 24 between two gate structures 20 separated by second (greater) pitch P2 have a greater stress level (internal stress) than epitaxial regions 24 between gate structures 20 separated by second (lesser) pitch P1. In various embodiments, the process of forming (source/drain) epitaxial regions 24 includes selectively forming (e.g., depositing) an n-doped or p-doped semiconductor layer including at least one of group IV, III-V, II-VI compound semiconductor materials.

Figure 12B:
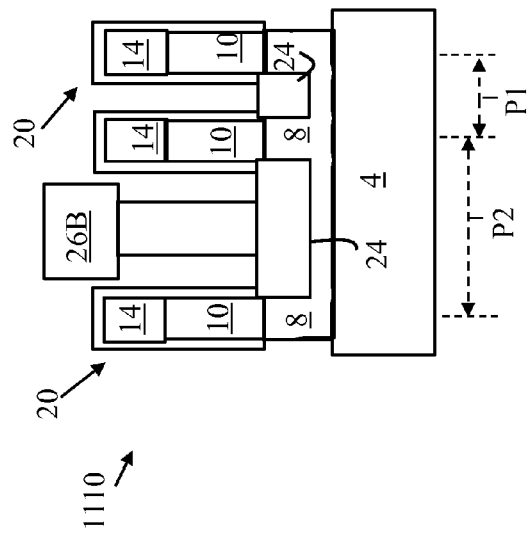
FIG. 12B shows a schematic cross-sectional depiction of an integrated circuit (IC) structure according to various additional embodiments It is noted that the drawings of the invention are not necessarily to scale. The drawings are intended to depict only typical aspects of the invention, and therefore should not be considered as limiting the scope of the invention. In the drawings, like numbering represents like elements between the drawings.
Figure 12A:
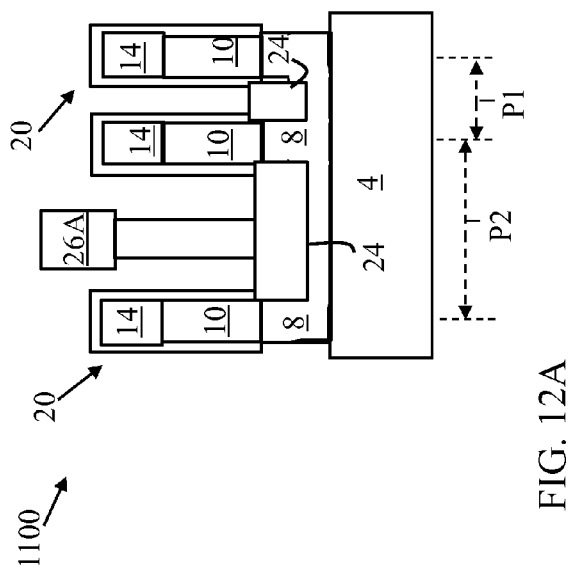
FIG. 12A shows a schematic cross-sectional depiction of an integrated circuit (IC) structure according to various embodiments.

FIGS. 12A and 12B illustrate an additional process including forming a contact 26 over the epitaxial region 24 to directly contact the epitaxial region 24. In one embodiment (FIG. 12A), a conventional ground rule contact 26A is formed to contact epitaxial region 24. FIG. 12B shows another embodiment, where a relatively wider contact 26B is formed to contact epitaxial region 24, where wider contact 26 B can have a width approximately twice the size of ground rule contact 26A. Contact 26A can have a relatively lower effective capacitance ($C_{eff}$) relative to contact 26B, while contact 26B has a lower effective resistance ($R_{eff}$) relative to contact 26A.

FIGS. 12A and 12B show integrated circuit (IC) structures 1100 and 1110, respectively. IC structures 1100 and 1110 can each include: substrate 4; a plurality of fin structures 8 overlying substrate 4; a plurality of gate structures 20 over fin structures 8 and substrate 4, the plurality of gate structures 20 directly contacting fin structures 8, where two neighboring gate structures 20 are separated by first pitch P1 and two distinct neighboring gate structures 20 are separated by second pitch P2, where second pitch P2 is greater than first pitch P1.

IC structures 1100 and 1110 can also include a plurality of epitaxial regions 24 over fin structure 8 and substrate 4 and between each of the plurality of gate structures 20, the plurality of epitaxial regions 24 including: a first epitaxial region 24A spanning first pitch P1 between the two neighboring gate structures 20; and a second epitaxial region 24B spanning the second pitch P2 between the two distinct neighboring gate structures 20. IC structure 1100 can further include contact 26A, while IC structure 1110 can further include contact 26B, where each contact 26A, 26B contacts second epitaxial region 26B.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method comprising:
   forming a doped silicon layer over a substrate;
   forming a plurality of fin structures from the doped silicon layer;
   forming a gate layer over the plurality of fin structures;
   forming a hard mask over the gate layer;
   etching the hard mask to remove a section of the hard mask, forming a modified hard mask exposing a portion of the gate layer;

etching the gate layer using the modified hard mask to remove the exposed portion of the gate layer and form a plurality of gate structures, wherein after the removing of the exposed portion of the gate layer, one of the plurality of gate structures is separated from a first neighboring gate structure by a first pitch and the one of the plurality of gate structures is separated from a second neighboring gate structure by a second pitch larger than the first pitch; and forming an epitaxial region over the plurality of fin structures and the substrate between the one of the plurality of gate structures and the second neighboring gate structure separated by the second pitch.

2. The method of claim 1, further comprising forming an additional epitaxial region over the plurality of fin structures and the substrate between the one of the plurality of gate structures and the first neighboring gate structure separated by the first pitch.

3. The method of claim 2, wherein the epitaxial region between the one of the plurality of gate structures and the second neighboring gate structure has a greater stress level than the epitaxial region between the one of the plurality of gate structures and the first neighboring gate structure separated by the first pitch.

4. The method of claim 1, further comprising forming a first contact over the epitaxial region to directly contact the epitaxial region.

5. The method of claim 4, wherein the first contact has a first width.

6. The method of claim 1, wherein the forming of the epitaxial region includes selectively depositing an n-doped or p-doped semiconductor layer between the one of the plurality of gate structures and the second neighboring gate structure.

7. The method of claim 1, further comprising etching to form a spacer recess in the substrate prior to forming the epitaxial region, wherein the etching includes using a silicon nitride (SiN) etch sensitive to the plurality of fin structures.

8. The method of claim 1, wherein the removing of the exposed portion of the gate layer includes selectively etching the portion of the gate layer using an etch process selective to at least one of a nitride or an oxide.

9. A method comprising:
forming a doped silicon layer over a substrate;
forming a plurality of fin structures from the doped silicon layer;
forming a gate layer over the plurality of fin structures;
forming a hard mask over the gate layer;
etching the hard mask to remove a section of the hard mask, forming a modified hard mask exposing a portion of the gate layer;
etching the gate layer using the modified hard mask to remove the exposed portion of the gate layer and form a plurality of gate structures, wherein after the removing of the exposed portion of the gate layer, one of the plurality of gate structures is separated from a first neighboring gate structure by a first pitch and the one of the plurality of gate structures is separated from a second neighboring gate structure by a second pitch larger than the first pitch;
forming a first epitaxial region over the substrate between the one of the plurality of gate structures and the second neighboring gate structure separated by the second pitch;
forming an additional epitaxial region over the substrate between the one of the plurality of gate structures and the first neighboring gate structure separated by the first pitch; and
forming a contact over the first epitaxial region to directly contact the first epitaxial region.

10. The method of claim 9, wherein the first epitaxial region has a greater stress level than the additional epitaxial region.

11. The method of claim 9, wherein the contact has a first width.

12. The method of claim 9, wherein the forming of the additional epitaxial region includes:
selectively depositing an n-doped or p-doped semiconductor layer between the one of the plurality of gate structures and the first neighboring gate structure.

13. The method of claim 9, further comprising etching to form a spacer recess in the substrate prior to forming the epitaxial region, wherein the etching includes using a silicon nitride (SiN) etch sensitive to the plurality of fin structures.

14. The method of claim 9, wherein the removing of the exposed portion of the gate layer includes selectively etching the portion of the gate layer using an etch process selective to at least one of a nitride or an oxide.

* * * * *